(12) United States Patent
Belady et al.

(10) Patent No.: US 7,511,959 B2
(45) Date of Patent: Mar. 31, 2009

(54) SCALABLE COMPUTING APPARATUS

(75) Inventors: Christian L. Belady, Mckinney, TX (US); Gary Gostin, Plano, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 40 days.

(21) Appl. No.: 11/789,651

(22) Filed: Apr. 25, 2007

(65) Prior Publication Data
US 2008/0270572 A1    Oct. 30, 2008

(51) Int. Cl.
    *H05K 7/20*    (2006.01)
(52) U.S. Cl. ............... 361/701; 361/689; 361/690; 361/696; 361/699; 165/104.33
(58) Field of Classification Search .............. None
    See application file for complete search history.

(56) References Cited

U.S. PATENT DOCUMENTS

| | | | |
|---|---|---|---|
| 6,973,801 B1 * | 12/2005 | Campbell et al. | 62/259.2 |
| 7,012,807 B2 * | 3/2006 | Chu et al. | 361/699 |
| 7,111,853 B2 * | 9/2006 | Tracewell et al. | 280/79.2 |
| 7,130,190 B1 * | 10/2006 | Baker | 361/695 |
| 7,184,269 B2 * | 2/2007 | Campbell et al. | 361/700 |
| 7,278,273 B1 * | 10/2007 | Whitted et al. | 62/259.2 |
| 2007/0185687 A1 * | 8/2007 | Speasl et al. | 702/185 |
| 2008/0055846 A1 * | 3/2008 | Clidaras et al. | 361/687 |
| 2008/0064317 A1 * | 3/2008 | Yates et al. | 454/118 |
| 2008/0094797 A1 * | 4/2008 | Coglitore et al. | 361/687 |
| 2008/0123288 A1 * | 5/2008 | Hillis | 361/687 |
| 2008/0158818 A1 * | 7/2008 | Clidaras et al. | 361/699 |

* cited by examiner

*Primary Examiner*—Boris L Chervinsky

(57) ABSTRACT

Disclosed are scalable computing pods that may be embodied in trailers, storage containers, or other portable structures that optimize computing, power, cooling and building infrastructure. The pods integrate required power and cooling infrastructure to provide a standalone turnkey computing solution. A user connects the pod to utility AC power and a data pipe. The scalable computing pods utilize liquid cooling, eliminate coolant conversions, and eliminate unnecessary power conversion to drastically improve efficiency.

18 Claims, 5 Drawing Sheets

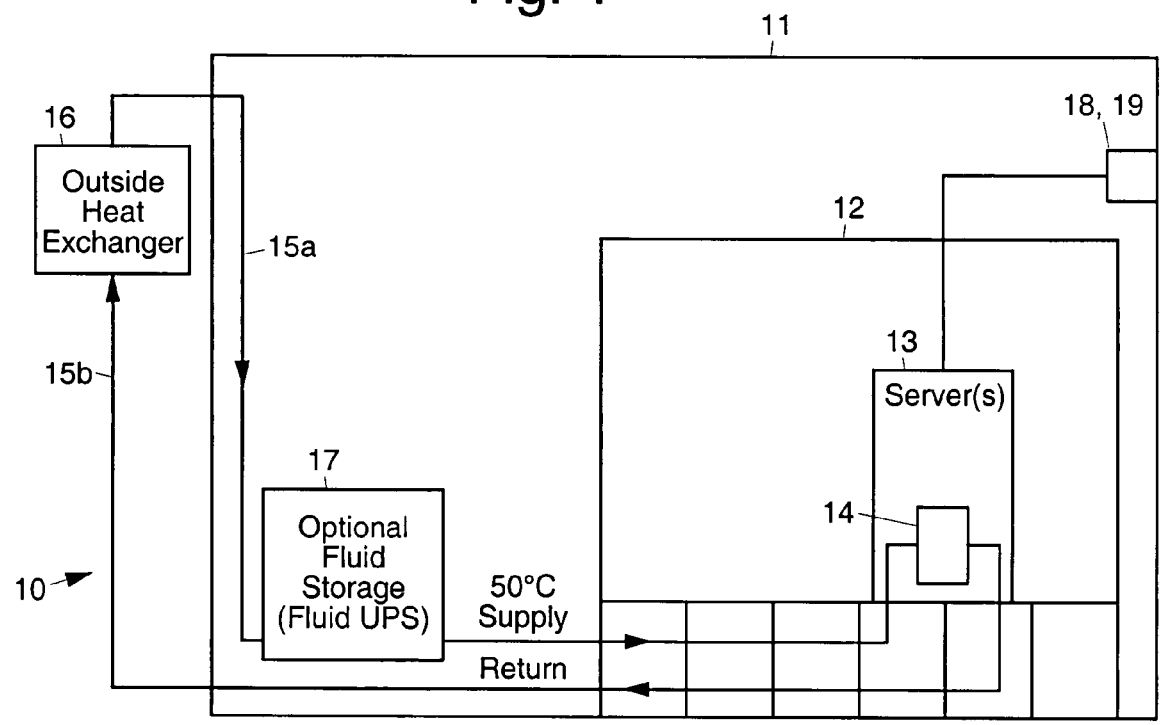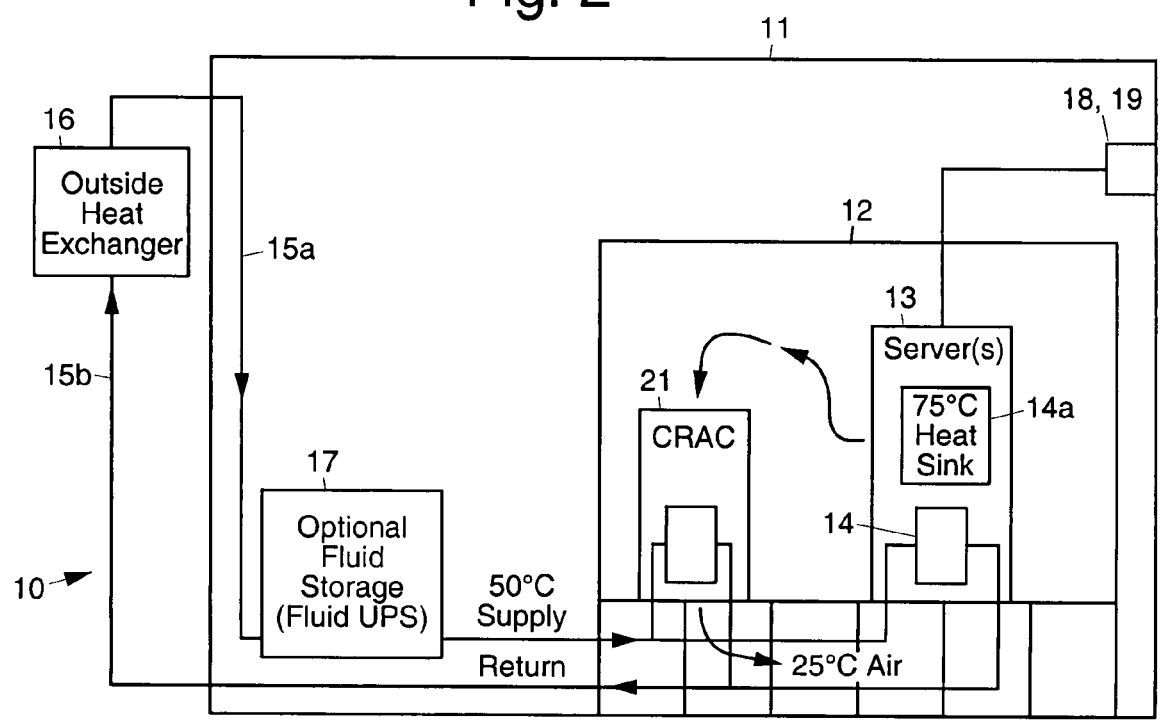

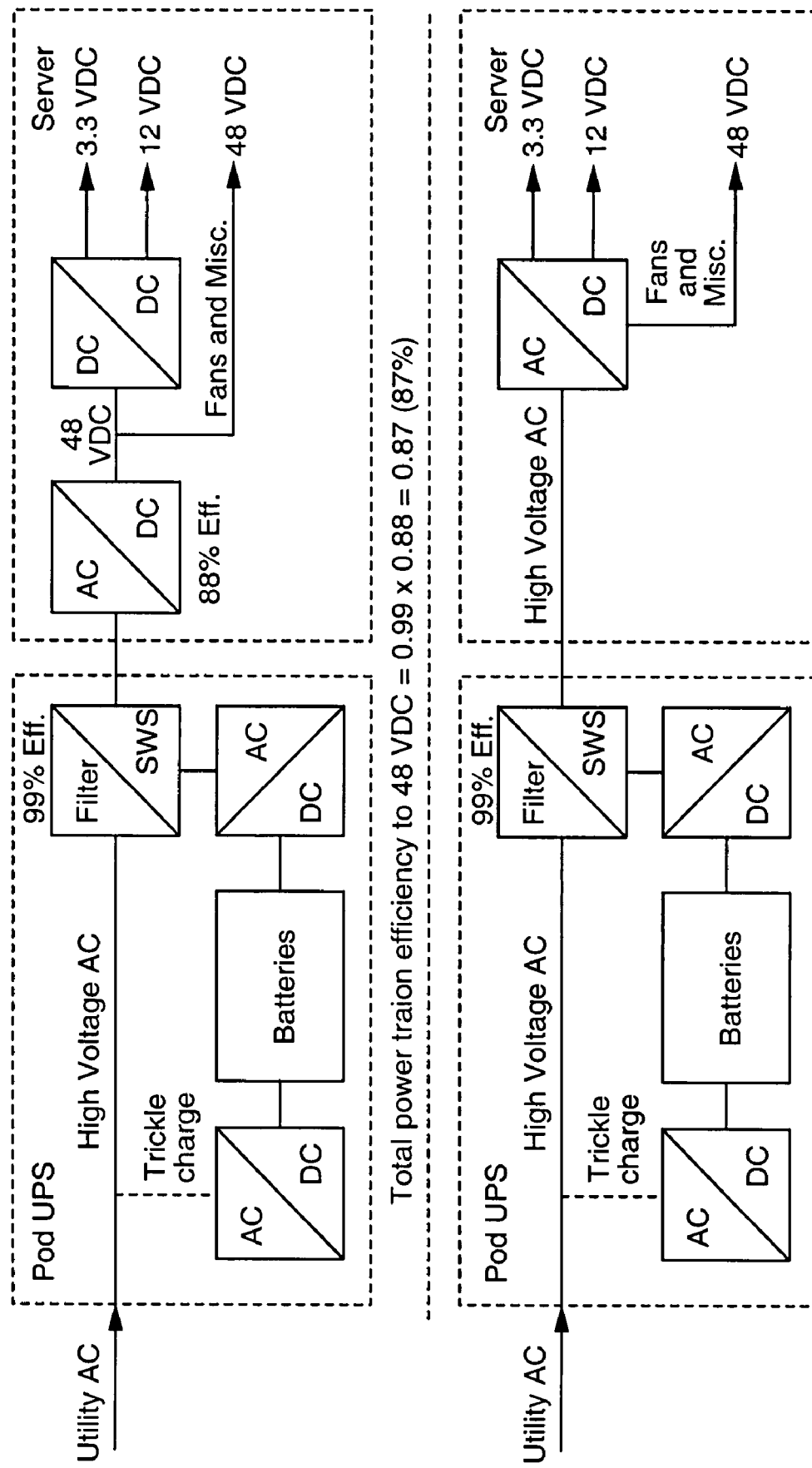

SCALABLE COMPUTING APPARATUS

BACKGROUND

The assignee of the present invention manufactures computing data centers. Historically, hardware and software solutions have been the cost drivers for information technology operations, but over time, energy costs and the data center infrastructure have become a dominant cost factor as a result of power density increases. The cost of a typical data center is in the range of $10,000 to $20,000 per kilowatt. Thus, the cost of the supporting infrastructure for one Superdome™ server manufactured by the assignee of the present invention is on the order of $200,000, and the current cost of electricity over a three year period is on the order of $50,000. Assuming $1.5 million cost for a single server Superdome™ data center solution manufactured by the assignee of the present invention, these costs amount to 17% of the acquisition cost. These costs are expected to be 35% in the 2009 timeframe assuming no energy cost increases.

For low end solutions, the energy cost percentage is even worse. For a solution using DL 360 servers manufactured by the assignee of the present invention, the 3 year energy cost alone is more than the hardware cost. For a $4000 DL 360 server, the infrastructure cost is $10,000 and the energy cost is $2,500 or about 300% of the acquisition cost.

Another problem is that as the cost for data center capacity goes up, the cost of increasing capacity for the incremental application or business solution is a huge step function at a cost in excess of $100 million as a result of building a new data center. It would be desirable to have a more scalable solution that allows the building infrastructure to scale with the growth in applications.

Users also want plug and play solutions. Users want solutions to their problems and not additional problems in managing technology shifts, not only computation but also with the infrastructure such as power and cooling. It would be desirable to have a solution that allows users to more easily manage the technology.

BRIEF DESCRIPTION OF THE DRAWINGS

The various features and advantages of disclosed embodiments may be more readily understood with reference to the following detailed description taken in conjunction with the accompanying drawings, wherein like reference numerals designate like structural elements, and in which:

FIG. 1 illustrates a first embodiment of exemplary scalable computing apparatus;

FIG. 2 illustrates a second embodiment of exemplary scalable computing apparatus;

FIG. 6 illustrates exemplary power improvements that may be obtained using the scalable computing apparatus.

DETAILED DESCRIPTION

Figure 3:
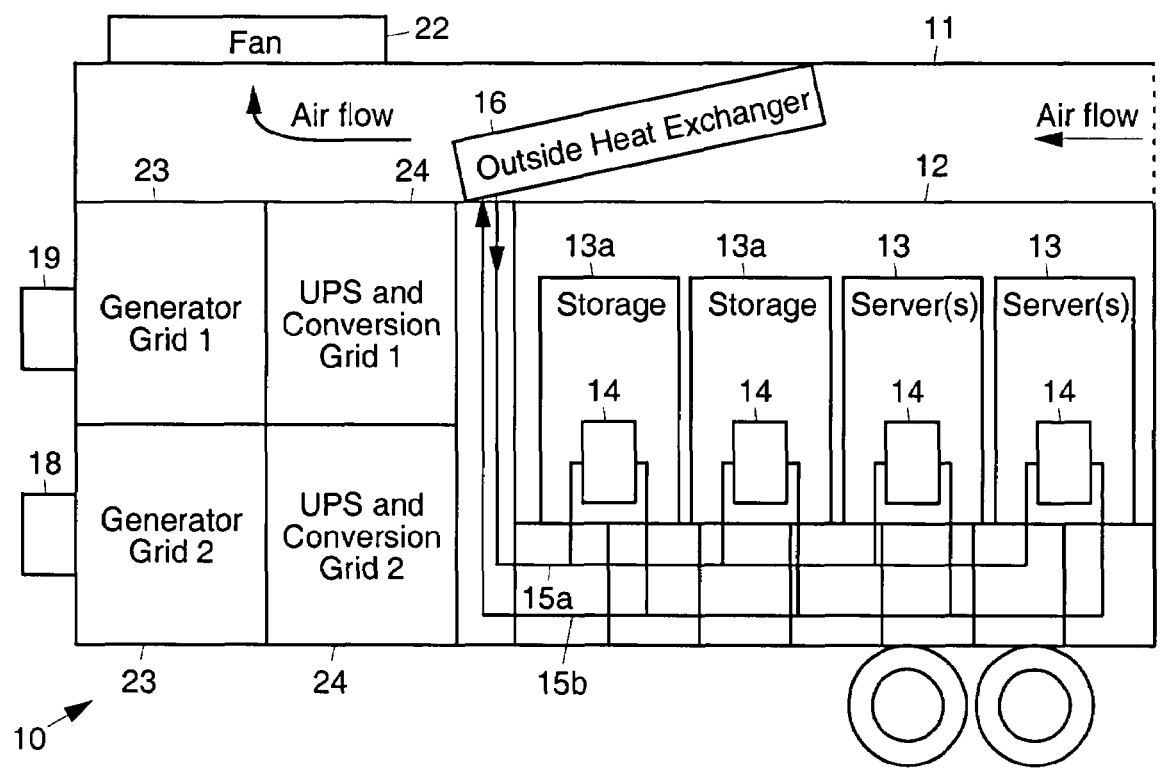
FIG. 3 illustrates a third embodiment of exemplary scalable computing apparatus.

Disclosed are various embodiments of scalable computing apparatus comprising a scalable infrastructure or computing pod that provides a "pay as you go" solution for computing, power, cooling and building infrastructure. This modular data center integrates all required power and cooling infrastructure into the computing pod so that it provides a standalone turnkey solution. The computing pod has all required computing resources (such as rackable servers, cabinets, and storage) and all required power and cooling infrastructure. The user simply connects the pod to substation power (utility AC) along with a fat data pipe. This provides a prepackaged and tested solution for the user.

The scalable computing apparatus or computing pod can utilize liquid cooling and eliminates coolant conversions (chillers, cooling towers, liquid to liquid heat exchangers, liquid to air heat exchangers, etc.). The scalable computing apparatus or computing pod also eliminates unnecessary power conversion (AC to DC, DC to AC) and drastically improves efficiency.

Referring to the drawing figures, FIG. 1 illustrates a first embodiment of exemplary scalable computing apparatus 10. The exemplary scalable computing apparatus 10 comprises an enclosure 11, such as a building 11 or structure 11, and which may be a trailer 11 or shipping container 11, which may be hauled by a truck, for example, which houses a data center 12 comprising a plurality of server computers 13. The server computers 13 are coupled to power distribution and network interconnections 18, 19 that allow them to be connected to a user's data center. The server computers 13 may be configured to operate on either AC or DC power, and may be optimized provide the best throughput/TCO for the resources that are used.

The server computers 13, or other components associated with the server computers 13, are coupled to one or more coldplates 14, which are continuously supplied by coolant so that it is at a temperature of about 75° C., for example. The coolant may be water, or a refrigerant, such as r134a refrigerant, for example. It is to be understood that air cooling may also be used in addition or in lieu of liquid cooling. The coldplates 14 are arranged to be in direct contact with electronics in the server computers 13 that are to be liquid cooled. The coldplates 14 are connected by way of supply and return lines 15a, 15b to a heat exchanger 16 which may be, but is not necessarily, located outside the building 11 or trailer 11. The heat exchanger 16 is typically located outside of the trailer 11 if liquid cooling is used. The coolant is typically supplied to the coldplates 14 at a temperature of about 50° C. (122° F.). Optional fluid storage apparatus 17 may be provided which is disposed in the supply line 15a. The fluid storage apparatus 17 is thus coupled between the heat exchanger and the coldplates 14.

This embodiment of the scalable computing apparatus 10 eliminates the conventionally-used chiller, coolant distribution unit (CDU) and cooling tower. This embodiment of the scalable computing apparatus 10 provides for a 33% energy savings in the data center by eliminating the need for most of the conventionally-used cooling infrastructure. There is no risk of condensation since all temperatures are above dewpoint. In addition, the optional fluid storage apparatus 17 does not need to be insulated. This embodiment also provides a substantially lower cost solution since some of the conventional infrastructure is eliminated.

FIG. 2 illustrates a second embodiment of exemplary scalable computing apparatus 10. The second embodiment provides for hybrid air and liquid cooled computing apparatus 10. The second embodiment is substantially the same as the above-described first embodiment, but additionally includes the following components. The server computers 13 are coupled to a heatsink 14a, which may be operated at around 75° C., for example, in addition to the coldplates 14. An air conditioning system 21 or refrigeration system 21, or computer room air conditioning (CRAC) 21 is provided within the data center 12. The air-conditioning system 21 is configured to circulate 25° C. chilled air through the data center 12 and over the heatsink 14a. The heatsink 14a transfers heat from the server computers 13 in order to keep them cool. Also, the air conditioning system 21, or refrigeration system 21, may be used without liquid cooling for the server computers 13.

The hybrid air and liquid cooled computing apparatus 10 provides for a 33% energy savings in the data center by eliminating the need for most of the conventionally-used cooling infrastructure. There is no risk of condensation since all temperatures are above dewpoint. The optional fluid storage apparatus 17 does not need to be insulated. Less costly traditional air cooling technology may be used to cool lower power density components by way of the heatsink 14a, while high flux devices may be liquid cooled.

FIG. 3 illustrates a third embodiment of exemplary scalable computing apparatus 10. This exemplary embodiment of the scalable computing apparatus 10 is configured in the form of a trailer 11. The data center 12 is disposed within the trailer 11 and contains a plurality of server computers 13 along with a plurality of storage devices 13a. This embodiment may also be designed to include a conventional chiller in the trailer 11.

The server computers 13 and storage devices 13a are coupled to respective coldplates 14, which are continuously supplied by coolant by way of a heat exchanger 16 and coolant supply and return lines 15a, 15b, so that they are at a temperature of about 75° C., for example. However, it is to be understood that some applications may require a coldplate temperature on the order of 20° C., for example. The heat exchanger 16 is located outside of the data center 12, but may be located within air ducting for the trailer 11, for example. A fan 22 is provided that causes air to flow over the heat exchanger 16 to remove heat from the coolant and thus cool the server computers 13 and storage devices 13a.

One or more redundant generator grids 23 and UPS and conversion grids 24 are coupled to the server computers 13 and storage devices 13a. The generator grids 23 and UPS and conversion grids 24 are each coupled to the utility AC power distribution interconnection 18. In particular, these connections may be made to different utility sources, for example. The generator grids 23 and UPS and conversion grids 24 are designed to provide standby and interruptible power to the server computers 13 and storage devices 13a, as well as other components of the scalable computing apparatus 10.

This embodiment of the computing apparatus 10 provides for an integrated software and hardware solution with a standard connection to the data center. This embodiment has all the advantages to the previously-described embodiments but is also mobile and scalable. Power losses may be minimized by eliminating power conversions in the manner discussed above. This mobile and scalable embodiment provides for a 33% energy savings in the data center by eliminating the need for most of the conventionally-used cooling infrastructure. There is no risk of condensation since all temperatures are above dewpoint. The optional fluid storage apparatus 17 does not need to be insulated.

Figure 4:
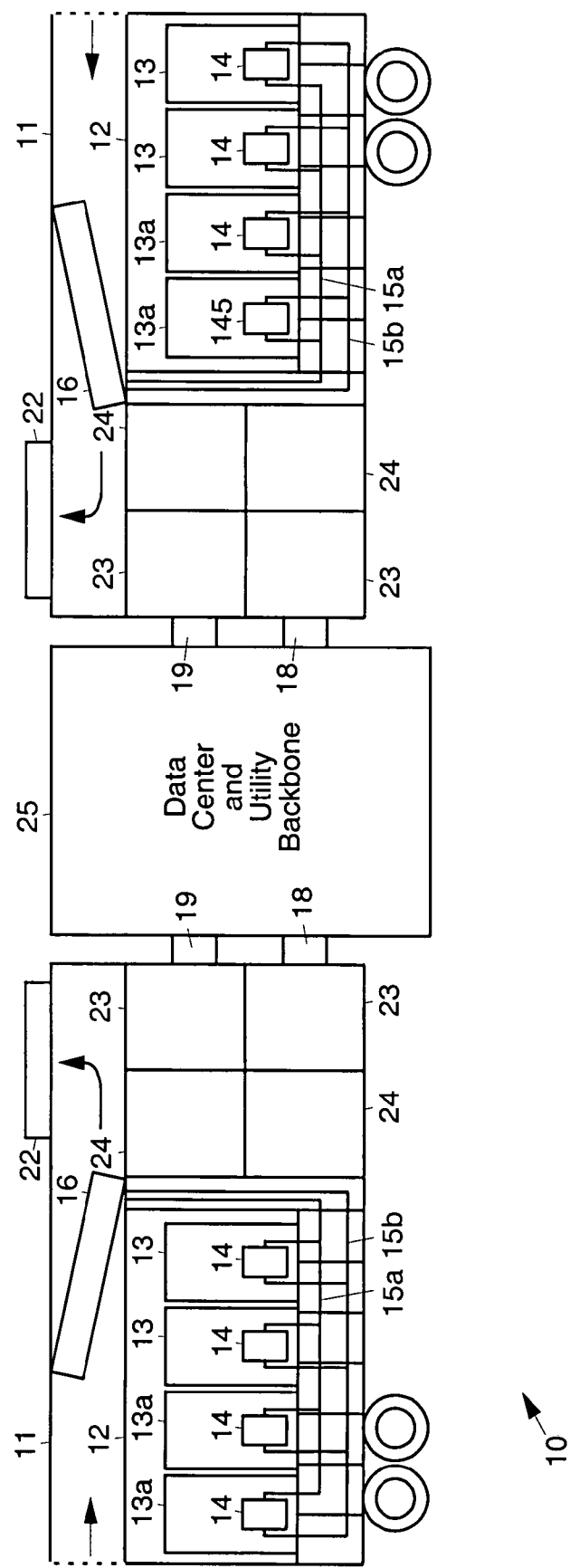
FIG. 4 illustrates an exemplary installation of the third embodiment of the scalable computing apparatus.
Figure 5:
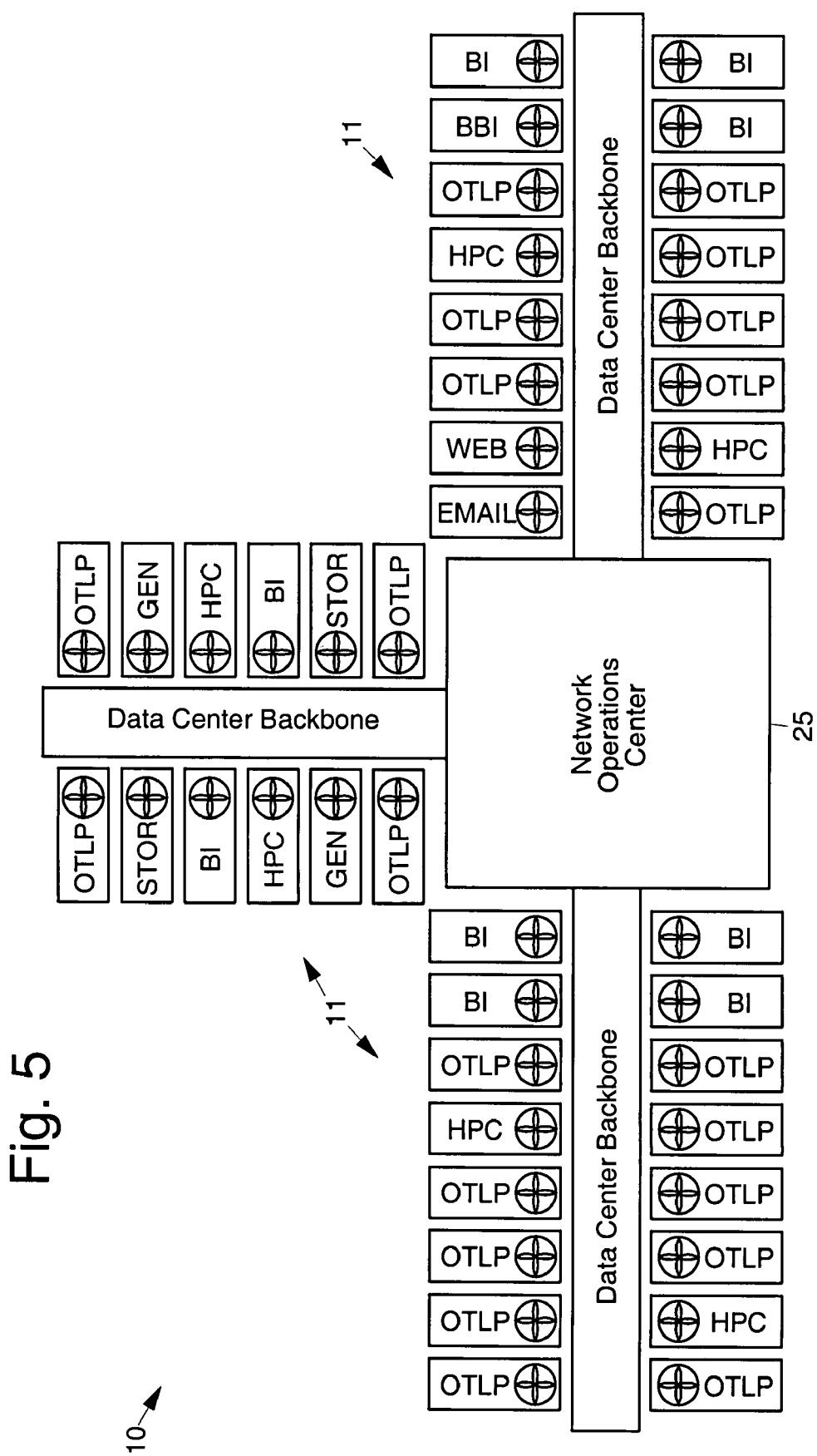
FIG. 5 is a top view of the exemplary installation shown in FIG. 4.

FIG. 4 illustrates an exemplary installation of the mobile and scalable computing apparatus 10 illustrated in FIG. 3. FIG. 5 is a top view of the exemplary installation shown in FIG. 4.

As is shown in FIG. 4, a plurality of trailers 11 generally configured as trailers 11 shown in FIG. 3 are coupled to a user's data center and utility backbone 25 or network operations center 25. FIG. 5 illustrates that the scalable computing apparatus 10 may be configured in various ways to provide specific information technology services. A typical data center implementation is shown in FIG. 5, which includes a number of online transaction processing (OLTP) trailers 11, a number of high performance computing (HPC) trailers 11, a number of storage device (STOR) trailers 11, a number of business intelligence (BI) trailers 11, email (EMAIL) and web server (WEB) trailers 11, and one or more generator (GEN) trailers 11, for example, in the event that the trailers 11 do not contain generators.

FIG. 6 illustrates exemplary power improvements that may be obtained using the scalable computing apparatus 11. As is shown in FIG. 6, the relative power improvement that can be realized using the computing pod 11 is on the order of 87 percent. This improvement involves the use of a UPS in the computing pod 11 that comprises an in-line filter and software switch (SWS) coupled to an AC/DC converter in series with battery storage and a DC/AC converter. The AC/DC converter is powered using a trickle charge. The server computers 13 may use one or more DC/DC converters which are about 88 percent efficient, or an AC/DC converter which is about 85 percent efficient. Conventional power conversion efficiencies using AC/DC and DC/AC conversion in conjunction with parallel battery storage have been on the order of 75-84 percent.

Utilizing the concepts discussed with regard to FIG. 6, the computing pod 11 may be configured to optimize power distribution and the UPS to minimize power conversions and provide a power topology from the power utility to the server 13 independent of the user. The user need not be aware of whether the compute pod 11 contains DC or AC servers 13. The most optimal total cost of ownership (TCO) solution may be provided to the user. In this way it is easy for the user to compare one solution to another.

The disclosed scalable computing apparatus 10 embodies servers 13, storage 13a, interruptible power supplies 24, cooling 16, and power and networking connections 18, 19 that may be configured to provide a complete modular solution and meet a users computing needs in a cost-effective manner. The scalable computing apparatus 10 may be delivered in the form of a trailer 11, or shipping container 11, that permits simple setup and redeployment if necessary. The scalable computing apparatus 10 saves energy since it is optimized for the computing resources that are used.

Energy costs and data center costs typically rise over time and new ways are needed to use power and cooling resources more effectively. As a result, efficiency is an important issue. The computing pod 11 provides high performance and effective cooling and power conditioning. The computing pod 11 allows for local optimization of power and cooling that match the needs of the computing resources.

There have been a number of industry initiatives to standardize the computing data center. The computing pod 11 eliminate the need for standardization at the server level, and provides a means for standardization at the point of utility and data connection.

Traditional data centers have used room-level air-conditioning systems. The computing pod 11 provides for a huge efficiency improvement by allowing the elimination of legacy power and cooling conditioning systems.

The computing pod 11 may be made weatherproof so that no other protective structure is needed. The computing pod 11 may be configured as a trailer that is hauled by a truck, for example. In this form, the computing pod may be backed into a docking structure that contains power distribution and an interconnect/network 25 for the user's data center. This interconnect and power docking structure can be standardized. The size of the computing pod can vary as a function of space required for the application or business intelligence (BI) solution.

All of the power conversion from a conventionally-used power substation occurs inside the computing pod 11. The user need not be concerned whether DC powered or AC powered servers 13 are used. The computing pod 11 is configured to provide the best throughput/TCO for the resources that are used.

All of the cooling infrastructure resides in the computing pod 11 and the servers 13 inside the pod 11 may be either air cooled or liquid cooled. Again, the computing pod is configured to provide the best throughput/TCO. By using this modular approach, the use of a cooling tower and chiller, which uses as much power as the IT equipment itself, can be eliminated. Thus, the throughput/Watt provided by the computing pod essentially doubles and provides much higher efficiency.

Users are looking at ways to add infrastructure resources in small chunks. The computing pod 11 matches the infrastructure chunk with the compute solution chunk so that they scale together. The combination of this, and the ability to match the power and cooling of the computing pod for optimum efficiency maximizes the throughput/TCO for the user.

Thus, scalable, self-contained computing pods have been disclosed. It is to be understood that the above-described embodiments are merely illustrative of some of the many specific embodiments that represent applications of the principles described herein. Clearly, numerous and other arrangements can be readily devised by those skilled in the art without departing from the scope of the invention.

What is claimed is:

1. Computing apparatus comprising:
   a transportable enclosure;
   a plurality of server computers disposed within the transportable enclosure; power distribution interconnections coupled to the server computers for connecting to a utility power source;
   network interconnections coupled to the server computers for connecting the server computers to a network;
   a refrigeration system disposed within the transportable enclosure for circulating chilled air within the enclosure to cool the server computers;
   a coldplate coupled to the server computers for cooling the server computers; and
   a heat exchanger disposed exterior to the enclosure that is remotely-located from and is coupled to the coldplate for communicating coolant to the coldplate.

2. The apparatus recited in claim 1 wherein the transportable enclosure comprises a trailer or storage container.

3. The apparatus recited in claim 1 further comprising fluid storage apparatus coupled between the heat exchanger and the coldplate.

4. The apparatus recited in claim 1 further comprising:
   a generator grid disposed within the transportable enclosure and coupled to the server computers; and
   a UPS and conversion grid disposed within the transportable enclosure and coupled between the generator grid and the server computers.

5. The apparatus recited in claim 4 wherein the UPS comprises:
   in-line filter and power switching apparatus coupled to the power distribution interconnections;
   an AC/DC converter coupled to the power distribution interconnections that is powered using a trickle charge;
   battery storage coupled to a DC output of the AC/DC converter; and
   a DC/AC converter coupled between the battery storage and the power switching apparatus.

6. The apparatus recited in claim 5 wherein each server computer comprises an AC/DC converter coupled to the in-line filter and power switching apparatus for powering the server computer with AC power.

7. The apparatus recited in claim 5 wherein each server computer comprises an AC/DC converter coupled to the in-line filter and power switching apparatus, and a DC/DC converter coupled to the AC/DC converter for powering the server computer with DC power.

8. Computing apparatus comprising:
   a transportable structure;
   a data center enclosure disposed within the transportable structure;
   computing apparatus disposed within the data center enclosure;
   power distribution interconnections coupled to the computing apparatus for connecting to a utility power source;
   network interconnections coupled to the computing apparatus for connecting to a network;
   a refrigeration system disposed within the data center enclosure for circulating chilled air within the data center enclosure to cool the computing apparatus;
   heat removal apparatus coupled to the computing apparatus for liquid cooling the computing apparatus; and
   a heat exchanger disposed exterior to the data center enclosure that is remotely-located from and is coupled to the heat removal apparatus and that removes heat from the heat removal apparatus.

9. The apparatus recited in claim 8 wherein the transportable structure comprises a trailer or storage container.

10. The apparatus recited in claim 8 further comprising:
    a generator grid disposed within the enclosure and coupled to the computing apparatus; and
    a UPS and conversion grid disposed within the enclosure and coupled between the generator grid and the computing apparatus.

11. The apparatus recited in claim 8 wherein the UPS comprises:
    an in-line filter and power switching apparatus coupled to the power distribution interconnections;
    an AC/DC converter coupled to the power distribution interconnections that is powered using a trickle charge;
    battery storage coupled to a DC output of the AC/DC converter; and
    a DC/AC converter coupled between the battery storage and the power switching apparatus.

12. The apparatus recited in claim 11 wherein the computing apparatus comprises an AC/DC converter coupled to the in-line filter and power switching apparatus for powering the server computer with AC power.

13. The apparatus recited in claim 11 wherein the computing apparatus comprises an AC/DC converter coupled to the in-line filter and power switching apparatus, and a DC/DC converter coupled to the AC/DC converter for powering the server computer with DC power.

14. Computing apparatus comprising:
    a transportable structure;
    an enclosure disposed within the transportable structure;
    computing means disposed within the enclosure;
    power distribution interconnections conned to the computing means for connecting to a utility power source;
    network interconnections coupled to the computing means for connecting to a network;
    a refrigeration system disposed within the enclosure for circulating chilled air within the enclosure to cool the computing means;

heat removal means in contact with the computing means for removing heat therefrom; and heat exchanger means disposed outside of the enclosure that is coupled to the heat removal means for removing heat from the heat removal means.

15. The apparatus recited in claim 14 wherein the transportable structure comprises a trailer or storage container.

16. The apparatus recited in claim 14 further comprising fluid storage apparatus coupled between the heat exchanger means and the heat removal means.

17. The apparatus recited in claim 14 further comprising:

a generator grid disposed within the enclosure and coupled to the computing means; and a UPS and conversion grid disposed within the enclosure and coupled between the generator grid and the computing means.

18. The apparatus recited in claim 17 wherein the UPS comprises:

in-line filter and power switching apparatus coupled to the power distribution interconnections;

an AC/DC converter coupled to the power distribution interconnections that is powered using a trickle charge;

battery storage coupled to a DC output of the AC/DC converter; and a DC/AC converter coupled between the battery storage and the power switching apparatus.

\* \* \* \* \*

UNITED STATES PATENT AND TRADEMARK OFFICE
CERTIFICATE OF CORRECTION

PATENT NO. : 7,511,959 B2
APPLICATION NO. : 11/789651
DATED : March 31, 2009
INVENTOR(S) : Christian L. Belady et al.

It is certified that error appears in the above-identified patent and that said Letters Patent is hereby corrected as shown below:

In column 6, line 61, in Claim 14, delete "conned" and insert -- coupled --, therefor.

Signed and Sealed this

Eleventh Day of August, 2009

David J. Kappos
*Director of the United States Patent and Trademark Office*